(12) United States Patent
Chen

(10) Patent No.: US 12,740,047 B2
(45) Date of Patent: Sep. 15, 2026

(54) MEMORY DEVICE AND METHOD OF FORMING THE SAME

(71) Applicant: NANYA TECHNOLOGY CORPORATION, New Taipei city (TW)

(72) Inventor: Wei Yu Chen, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 348 days.

(21) Appl. No.: 18/648,349

(22) Filed: Apr. 27, 2024

(65) Prior Publication Data

US 2025/0338482 A1 Oct. 30, 2025

(51) Int. Cl.
*H10B 12/00* (2023.01)

(52) U.S. Cl.
CPC ........... *H10B 12/33* (2023.02); *H10B 12/053* (2023.02); *H10B 12/315* (2023.02)

(58) Field of Classification Search
CPC ..... H10B 12/33; H10B 12/053; H10B 12/315
USPC ........................................................ 257/296
See application file for complete search history.

(56) References Cited

U.S. PATENT DOCUMENTS

| | | | | |
|---|---|---|---|---|
| 6,544,834 | B1 * | 4/2003 | Sugawara | H10B 12/03 257/E27.088 |
| 7,858,960 | B2 * | 12/2010 | Chang | H10B 63/20 257/E45.002 |
| 11,812,610 | B2 * | 11/2023 | Hopkins | H10B 41/27 |
| 2021/0118801 | A1 | 4/2021 | Wang et al. | |
| 2022/0037510 | A1 | 2/2022 | Cheng | |

* cited by examiner

*Primary Examiner* — Tu-Tu V Ho
(74) *Attorney, Agent, or Firm* — CKC & Partners Co., LLC

(57) ABSTRACT

A method of forming a memory device includes forming a trench in a dielectric structure. The method further includes forming a conductive layer in the trench of the dielectric structure. The method further includes forming a first nitride spacer lining the trench. The method further includes etching the first nitride spacer to expose the conductive layer. The method further includes forming a second nitride spacer lining the first nitride spacer and the conductive layer. The method further includes forming a metal layer in the trench and over the conductive layer.

20 Claims, 22 Drawing Sheets

MEMORY DEVICE AND METHOD OF FORMING THE SAME

BACKGROUND

Field of Disclosure

The present disclosure relates to a memory device and a method of forming the same.

Description of Related Art

Memory cells in the dynamic random access memory (DRAM) have been scaled down continuously to integrate a larger number of the memory cells in a unit area. However, this scaling down process can lead to certain problems in the formation of memory cells. For example, as critical dimensions shrink, it becomes increasingly difficult to fill the features with metal contacts while keeping resistances to a minimum.

Accordingly, how to provide a memory device and a method of forming the same to solve the aforementioned problems becomes an important issue to be solved by those in the industry.

SUMMARY

An aspect of the disclosure is to provide a memory device and a method of forming the same that may efficiently solve the aforementioned problems.

According to an embodiment of the disclosure, a method of forming a memory device includes forming a trench in a dielectric structure. The method further includes forming a conductive layer in the trench of the dielectric structure. The method further includes forming a first nitride spacer lining the trench. The method further includes etching the first nitride spacer to expose the conductive layer. The method further includes forming a second nitride spacer lining the first nitride spacer and the conductive layer. The method further includes forming a metal layer in the trench and over the conductive layer.

According to another embodiment of the disclosure, a memory device includes a dielectric structure, a conductive layer, a dielectric nitride layer, a conductive nitride layer, and a metal layer. The conductive layer is disposed in the dielectric structure. The dielectric nitride layer is lining a sidewall of the dielectric structure. The conductive nitride layer extends from an inner sidewall of the dielectric nitride layer to a top surface of the conductive layer. The metal layer is disposed over the conductive nitride layer.

Accordingly, in the memory device and the method of forming the memory device of some embodiments of the present disclosure, first nitride spacers made of silicon nitride are disposed lining deep trenches, and second nitride spacers made of titanium nitride are disposed over the first nitride spacers. This enhances the surface coverage of the second nitride spacers. Thereby, the tungsten-containing metal layer that is disposed on the second nitride spacers may have better adhesion, which leads to a memory device with reduced resistance and improved electrical contact.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
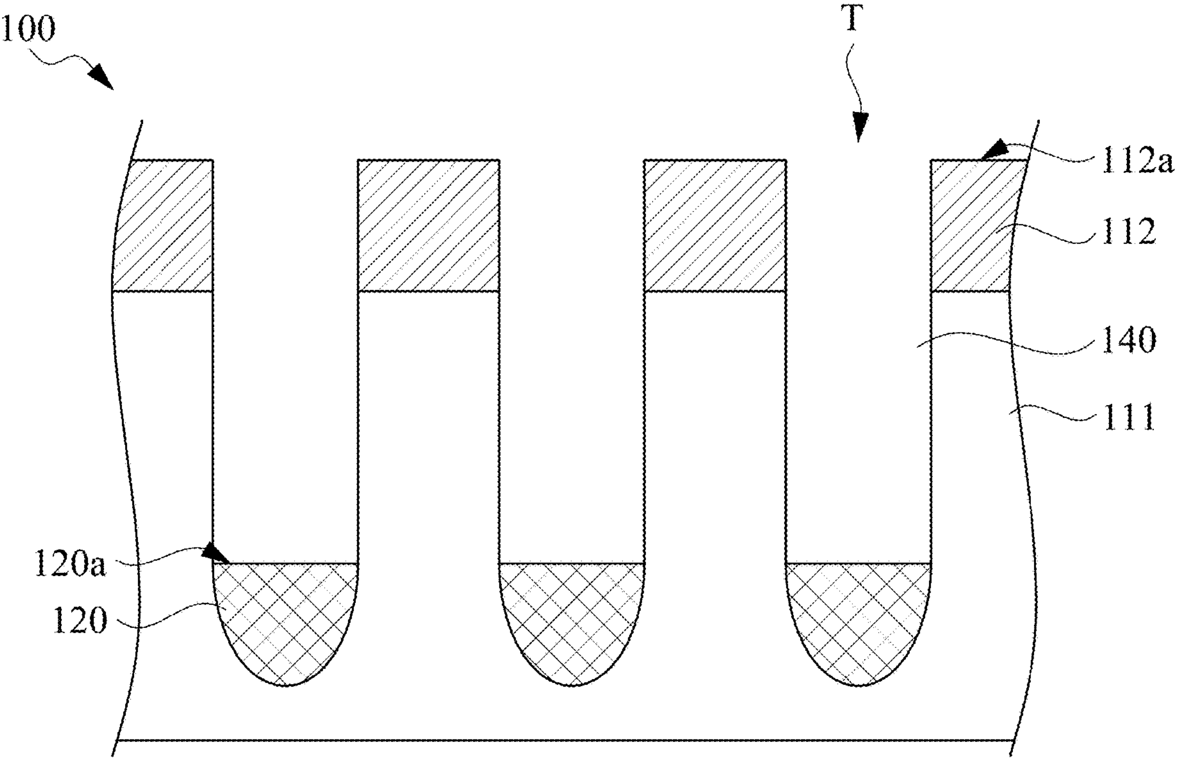
FIG. 1 to FIG. 6 are cross-sectional views of intermediate stages of a method of forming a memory device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

Reference is made to FIG. 1 to FIG. 6. FIG. 1 to FIG. 6 are cross-sectional views of intermediate stages of a method of forming a memory device 10 according to some embodiments of the present disclosure.

Reference is first made to FIG. 1. A dielectric structure 110 is provided. In some embodiments, the dielectric structure 110 includes a dielectric layer 111 and a dielectric layer 112 over the dielectric layer 111. The dielectric layer 111 may be a lower portion of the dielectric structure 110 and the dielectric layer 112 may be an upper portion of the dielectric structure 110. The dielectric layer 111 and the dielectric layer 112 may be made of different materials. In some embodiments, the dielectric layer 111 may be made of oxide, such as silicon oxide (SiO) and the dielectric layer 112 of the dielectric structure 110 may be made of silicon nitride (SiN). In some embodiments, the dielectric structure 110 may act as a substrate layer for the following formed structures discussed later.

As shown in FIG. 1, trenches T are formed in the dielectric structure 110. Conductive layers 120 are formed in the respective trenches T. In some embodiments, the conductive layers 120 include a silicon-containing material or a metal-containing material. For example, the conductive layers 120 may include polysilicon, metal, metal nitride, metal silicide, metal carbide, or the like. In some embodiments, the conductive layers 120 may be formed by, for example, depositing a conductive material overfilling the trenches T, and then etching back the conductive material such that a top surface of the conductive material is lower than a top surface of the dielectric layer 111. The remaining portions of the conductive material in the trenches T are referred to as the conductive layers 120.

Figure 2:
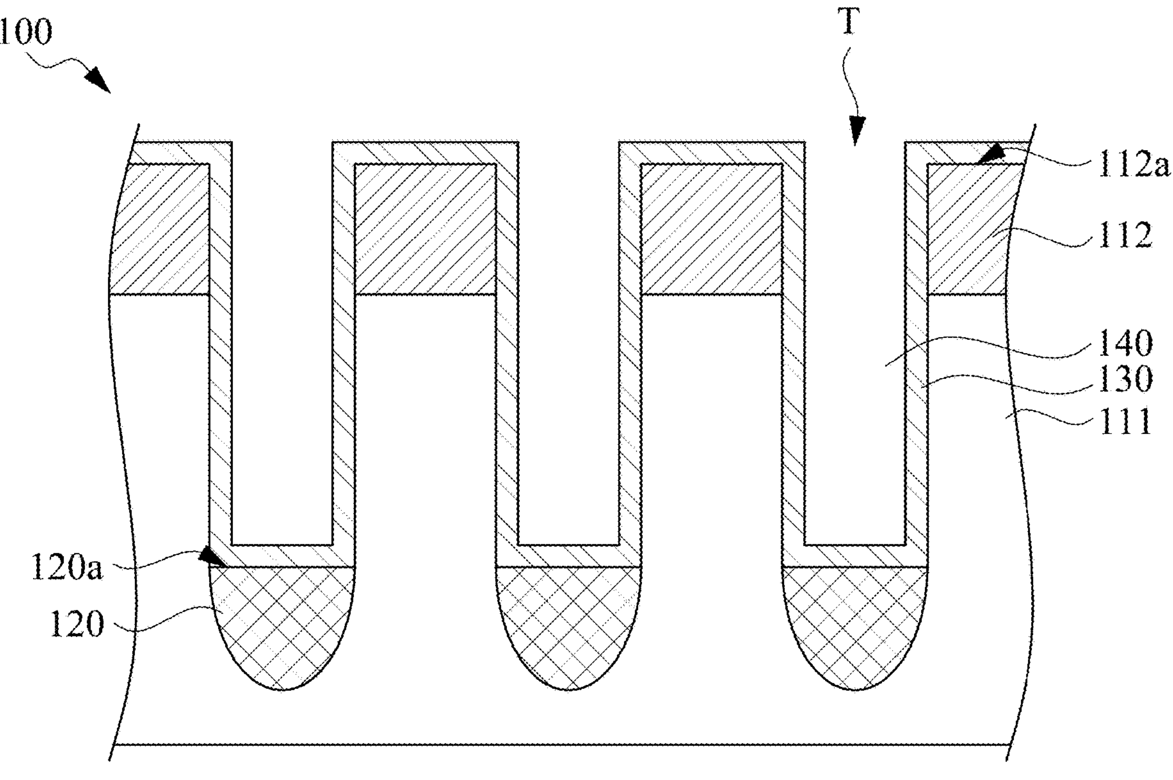

Reference is then made to FIG. 2. A first nitride spacer 130 is formed lining the trenches T. It should be noted that the term "lining" herein refers to a component conformally covering another component. In some embodiments, the first nitride spacer 130 is formed lining a top surface 112*a* of the dielectric layer 112 of the dielectric structure 110. In some embodiments, the first nitride spacer 130 and the dielectric layer 112 of the dielectric structure 110 may include the same material.

Figure 3:
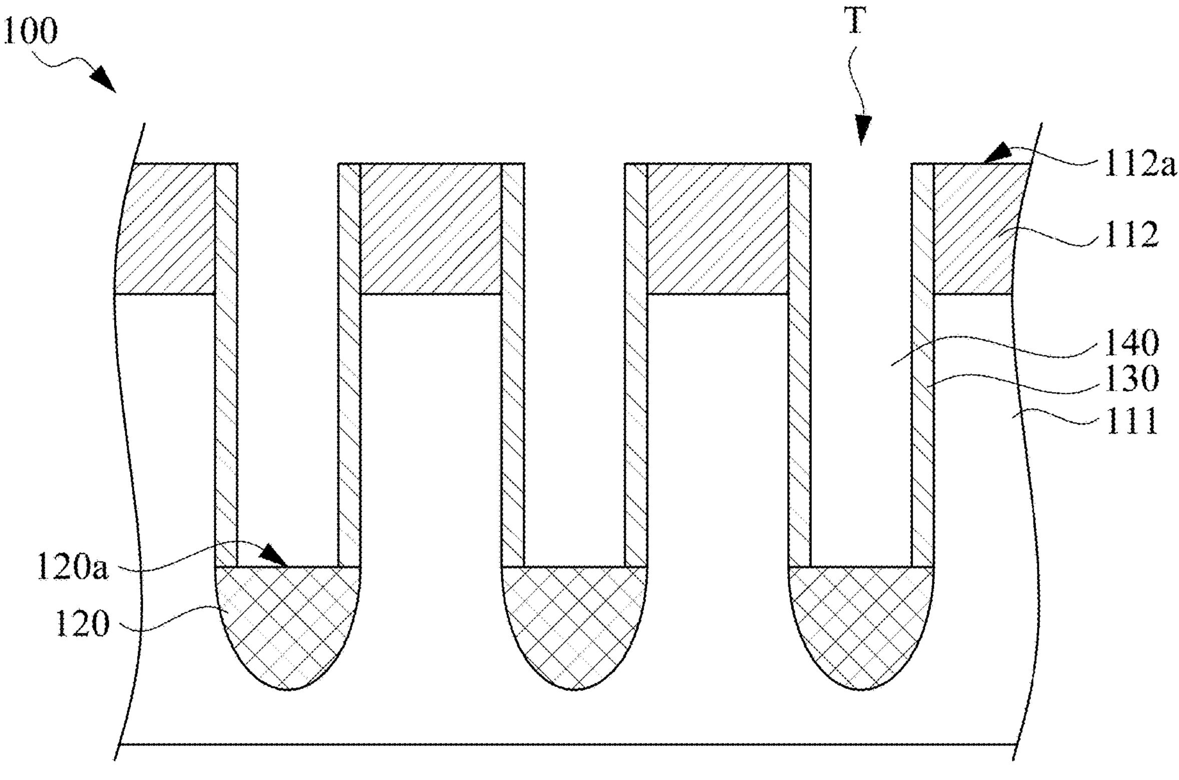

Reference is then made to FIG. 3. An etching process is performed to remove horizontal portions of the first nitride spacer 130 to expose the conductive layers 120 (e.g., a top surface 120*a* of the conductive layers 120). The vertical portions of the first nitride spacer 130 may remain on sidewalls of the trenches T once the etching process is completed. In some embodiments, the top surface 112*a* of the dielectric layer 112 of the dielectric structure 110 may also be exposed once the etching process is completed. In some embodiments, the etching process may include a dry etching process, such as a plasma etching.

Figure 4:
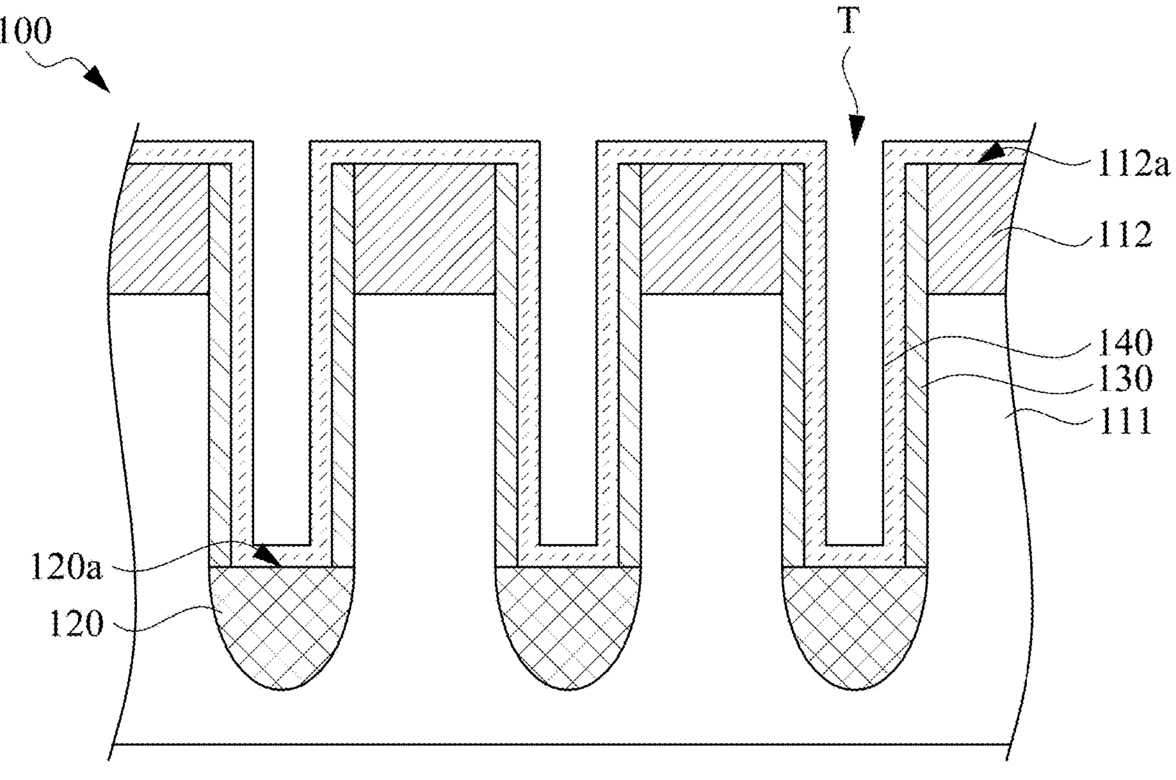

Reference is then made to FIG. 4. A second nitride spacer 140 is formed lining the dielectric layer 112, the first nitride spacer 130 and the conductive layers 120. Moreover, in some embodiments, the second nitride spacer 140 is formed covering and in contact with the top surface 120*a* of the conductive layers 120. The second nitride spacer 140 may be made of a conductive material, such as titanium nitride (TIN), titanium silicon nitrate (TiSiN), tantalum nitride (TaN), tantalum silicon nitrate (TaSiN), tungsten nitride (WN).

In some embodiments, the second nitride spacer 140 includes a different material than the first nitride spacer 130. To be more specific, the first nitride spacer 130 is made of a dielectric material, while the second nitride spacer 140 is made of a conductive material. For example, the first nitride spacer 130 may be made of silicon nitride, and the second nitride spacer 140 may be made of titanium nitride (TiN).

It should be noted that during the formation of the second nitride spacer 140, the first nitride spacer 130 separates the second nitride spacer 140 from the dielectric layer 111 of the dielectric structure 110. This will be beneficial for the deposition of the following formed metal layer (e.g., the metal layer 150 in FIG. 5), and will be discussed in more detail later.

Figure 5:
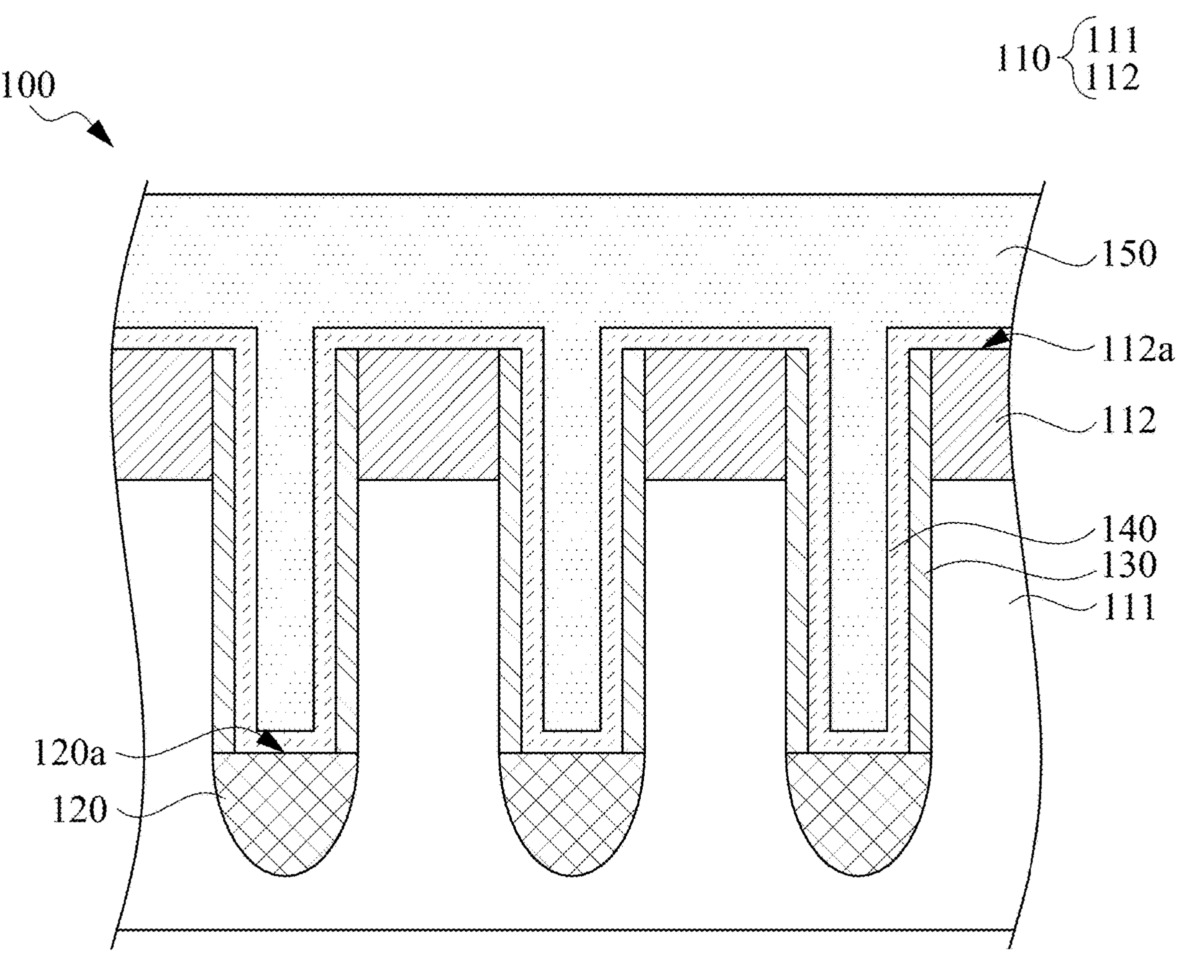

Reference is then made to FIG. 5. A metal layer 150 is formed in the trenches T and over the conductive layers 120. In some embodiments, the metal layer 150 is made of tungsten (W).

Since tungsten does not adhere well to dielectric materials such as silicon oxide and silicon nitride, in embodiments where the metal layer 150 includes tungsten, the second nitride spacer 140 may act as an adhesion layer to promote adhesion of the metal layer 150. In addition, the second nitride spacer 140 may also act as a diffusion barrier to protect the silicon-containing dielectric structure 110 during the formation of the metal layer 150.

In the present disclosure, prior to forming the second nitride spacer 140, a first nitride spacer 130 is formed along sidewalls of the trenches T to cover the dielectric layer 111 and the dielectric layer 112. This will be beneficial to improving gap-fill capability for forming the metal layer 150. For example, if the first nitride spacer 130 is absent, the second nitride spacer 140 will be formed along the dielectric layer 111 and the dielectric layer 112 having different material surfaces. However, during the deposition of the second nitride spacer 140, the material of the second nitride spacer 140 may include different nucleation rates on different materials. For example, the material of the second nitride spacer 140 may include a higher growing rate on the dielectric layer 112 than on the dielectric layer 111, such that the portion of the second nitride spacer 140 along the dielectric layer 112 will be formed thicker than the portion of the second nitride spacer 140 along the dielectric layer 111, thereby narrowing the openings of the trenches T. As a result, during the deposition of the metal layer 150, voids or seams may likely be formed in the metal layer 150, and may deteriorate the device performance. In the present disclosure, because the first nitride spacer 130 is first formed along the dielectric layer 111 and the dielectric layer 112, the second nitride spacer 140 can be deposited in the trenches T along a single-material surface (e.g., the first nitride spacer 130) instead of a multi-material surface (e.g., the dielectric layer 111 and the dielectric layer 112). Accordingly, the second nitride spacer 140 may be formed having a substantially uniform thickness in the trenches T, and will improve the gap-fill capability of the metal layer 150, which in turn will reduce voids or seams being formed in the metal layer 150. With such configuration, the device performance may be improved.

Figure 6:
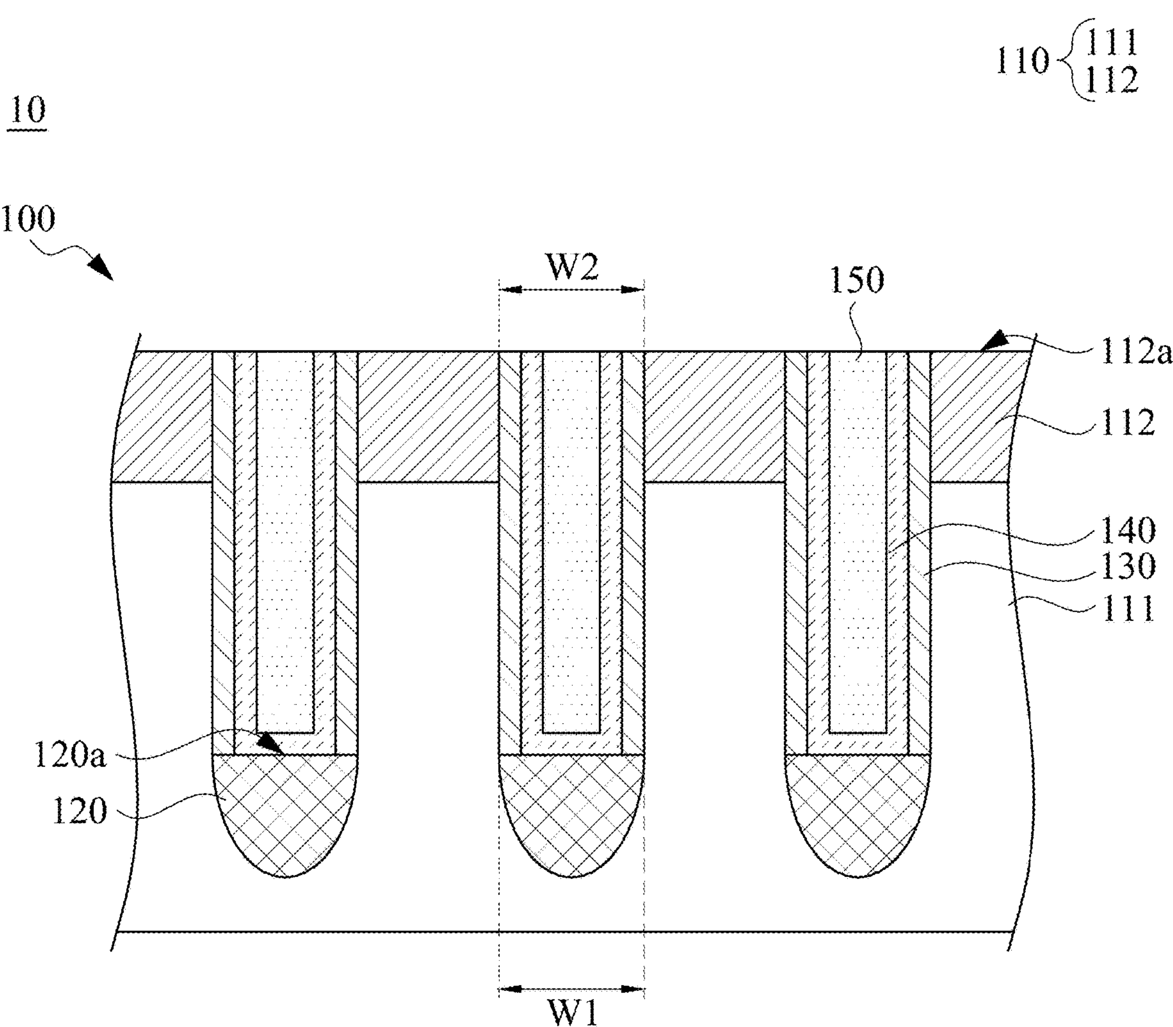

Reference is then made to FIG. 6. A planarization process is performed to the second nitride spacer 140 and the metal layer 150 until the dielectric structure 110 is exposed. To be more specific, the planarization process is performed such that the top surface 112*a* of the dielectric layer 112 of the dielectric structure 110 is exposed. In some embodiments, the planarization process is performed such that top surfaces of the dielectric structure 110, the first nitride spacer 130, the second nitride spacer 140, and the metal layer 150 are substantially level with each other.

As shown in FIG. 6, the resultant memory device 10 includes a dielectric structure 110, conductive layers 120, a first nitride spacer 130, a second nitride spacer 140, and a metal layer 150. The conductive layers 120 are disposed in the dielectric structure 110. The first nitride spacer 130 is disposed lining a sidewall of the dielectric structure 110. The second nitride spacer 140 is disposed extending from an inner sidewall of the first nitride spacer 130 to the top surface 120*a* of the conductive layers 120. The metal layer 150 is disposed over the second nitride spacer 140.

In the cross-sectional view of FIG. 6, the first nitride spacer 130 has a bar shape cross-section. In other words, the first nitride spacer 130 laterally surrounds the second nitride spacer 140. On the other hand, in the cross-sectional view, the second nitride spacer 140 has a U-shape cross-section. That is, the second nitride spacer 140 cups the metal layer 150. In addition, the second nitride spacer 140 is spaced apart from the dielectric layer 111 of the dielectric structure 110 through the first nitride spacer 130 and the conductive layers 120.

It should be noted that since the conductive layers 120 and the first nitride spacer 130 are sequentially deposited in the trenches T, an outer sidewall of the first nitride spacer 130 is coterminous with an edge of the conductive layers 120. Moreover, the largest width W2 of the first nitride spacer 130 is substantially equal to the largest width W1 of the conductive layers 120. In other words, an orthographic projection area of the first nitride spacer 130 projected on the substrate 100 is overlapped with an orthographic projection area of the conductive layers 120 projected on the substrate 100.

Furthermore, as shown in FIG. 6, the conductive layers 120 are in contact with both the first nitride spacer 130 and the second nitride spacer 140. To be more specific, a bottom end of the first nitride spacer 130 is coterminous with a bottom surface of the second nitride spacer 140.

In embodiments where the first nitride spacer 130 is made of a dielectric material and the second nitride spacer 140 is made of a conductive material, the first nitride spacer 130 may also be referred to as a dielectric nitride layer, and the second nitride spacer 140 may also be referred to as a conductive nitride layer.

Figure 7:
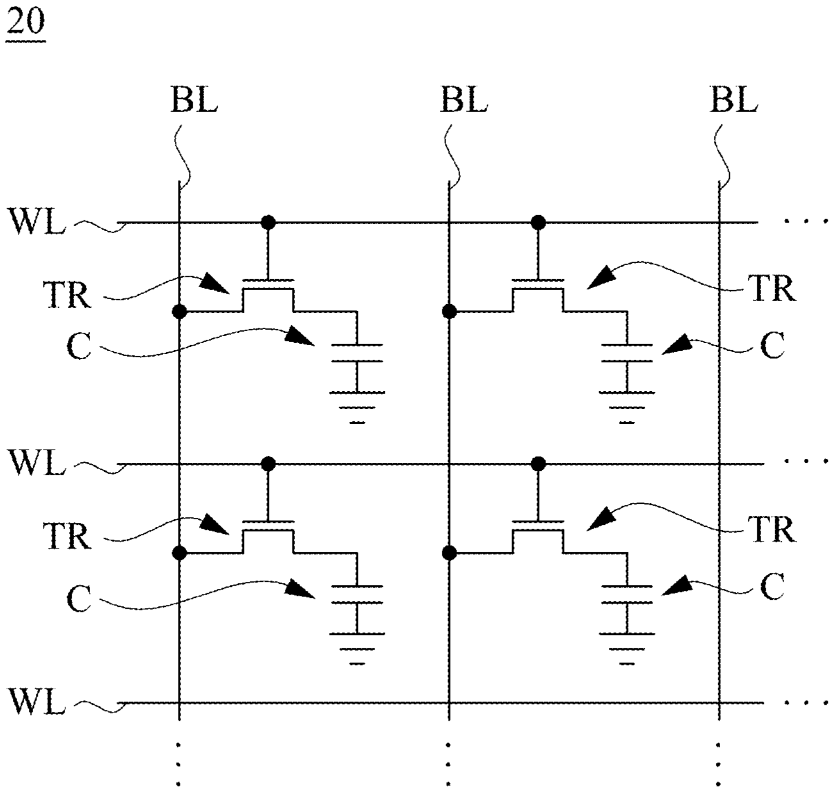
FIG. 7 is a circuit diagram of a memory device according to some other embodiments of the present disclosure.

Reference is now made to FIG. 7 to FIG. 15. FIG. 7 is a circuit diagram of a memory device 20 according to some other embodiments of the present disclosure. FIG. 8 to FIG. 15 are cross-sectional views of intermediate stages of a method of forming a memory device 20 according to some other embodiments of the present disclosure.

Reference is first made to FIG. 7. The memory device 20 includes a dynamic random access memory (DRAM) device. In some embodiments, the memory device 20 includes a plurality of memory cells arranged in an array. Each of the memory cells incorporates a capacitor C and a transistor TR. The capacitor C temporarily stores data based on the charged state of the capacitor C. A bit line BL is electrically connected to a source region of the transistor TR. A word line WL is electrically connected to a gate region of the transistor TR, as shown in FIG. 7.

By controlling the voltage at the gate of the transistor TR through the word line WL, a voltage potential may be created across the transistor TR such that electrical charge may flow from the drain of the transistor TR to the capacitor C. Therefore, the electrical charge stored in the capacitor C may be interpreted as a binary data value in the corresponding memory cell.

Figure 8:
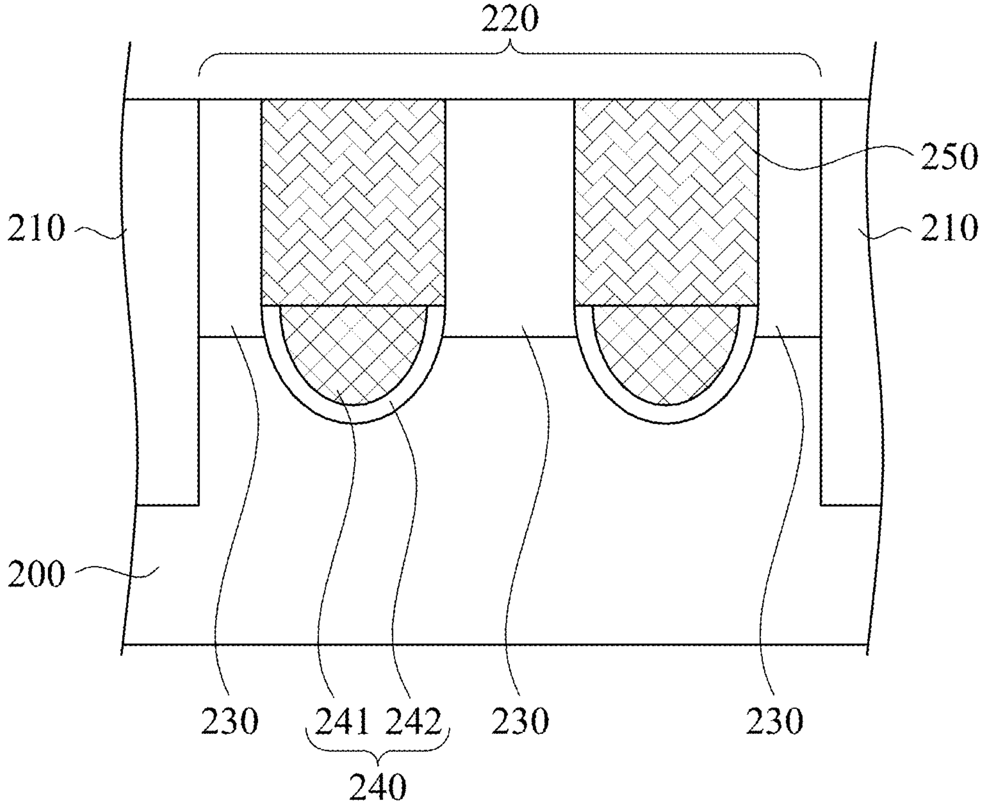
FIG. 8 to FIG. 15 are cross-sectional views of intermediate stages of a method of forming a memory device according to some other embodiments of the present disclosure.

Reference is now made to FIG. 8. An intermediate structure including a substrate 200, first isolation structures 210, source/drain regions 230, and gate structures 240 is provided. The first isolation structures 210 are disposed in the substrate 200 for defining an active area 220. In some embodiments, the first isolation structures 210 are shallow trench isolations (STI). As shown in FIG. 8, the source/drain regions 230 and the gate structures 240 are disposed in the active area 220. In some embodiments, as shown in FIG. 8, the gate structures 240 are buried gate structures and serves as buried word lines for the memory device 20. In some embodiments, each of the gate structures 240 includes a gate electrode 241 and a gate oxide 242 cupping the gate electrode 241. In some embodiments, the gate electrode 241 includes a silicon-containing material or a metal-containing material. For example, the gate electrode 241 may include polysilicon, metal, metal nitride, metal silicide, metal carbide, or the like. The source/drain regions 230 are disposed at two opposite sides of their respective gate structures 240. The source/drain regions 230 may include opposite conductivity type than the active area 220. Accordingly, the active area 220, the source/drain regions 230, and the gate structures 240 may collectively serve as the transistors TR of the memory cells. In addition, in some embodiments, the intermediate structure further includes second isolation structures 250 disposed over the gate structures 240, as shown in FIG. 8.

Figure 9:
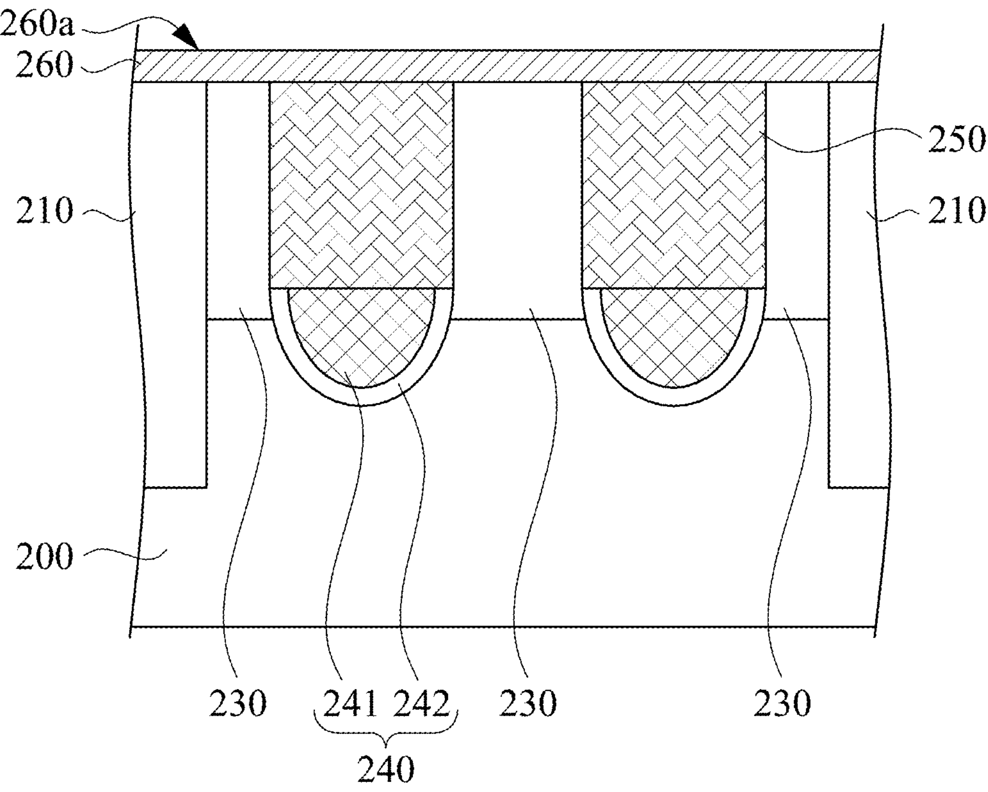

Reference is then made to FIG. 9. A dielectric layer 260 is formed over the substrate 200. To be more specific, the dielectric layer 260 covers the first isolation structures 210, the source/drain regions 230, and the second isolation structures 250.

Figure 10:
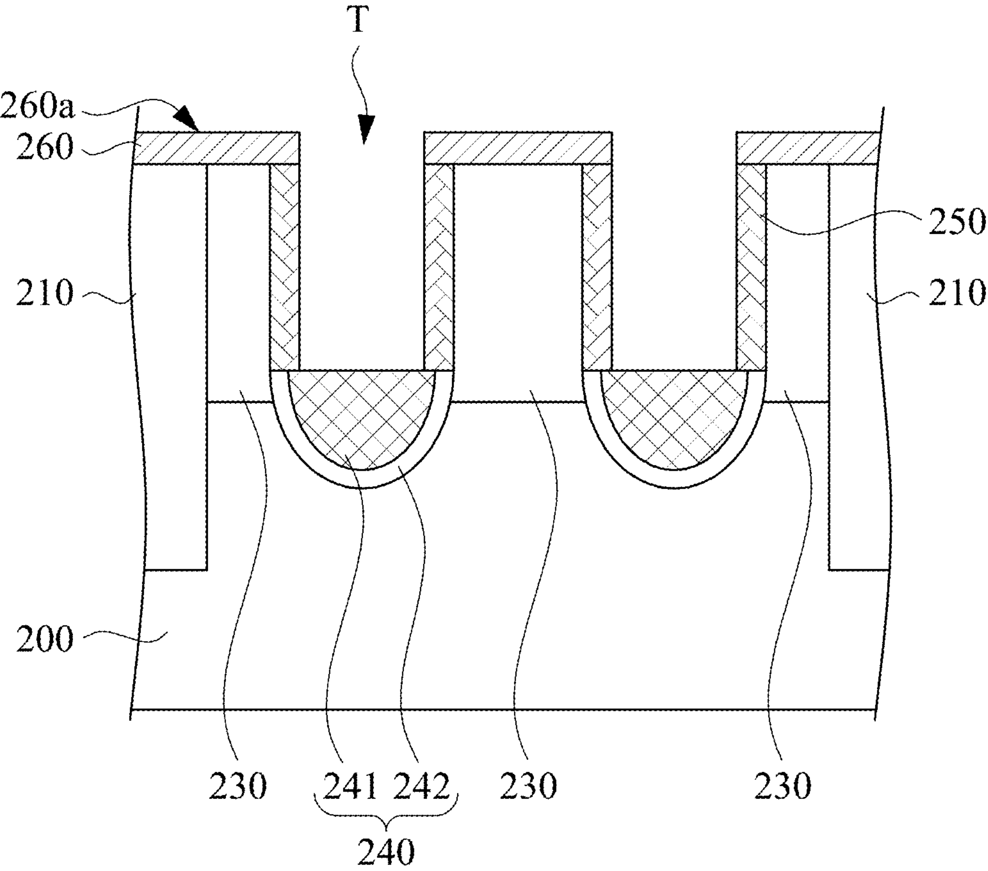

Reference is then made to FIG. 10. Trenches T are formed through the dielectric layer 260 and the second isolation structures 250. To be more specific, the trenches T expose top surfaces of the gate structures 240.

Figure 11:
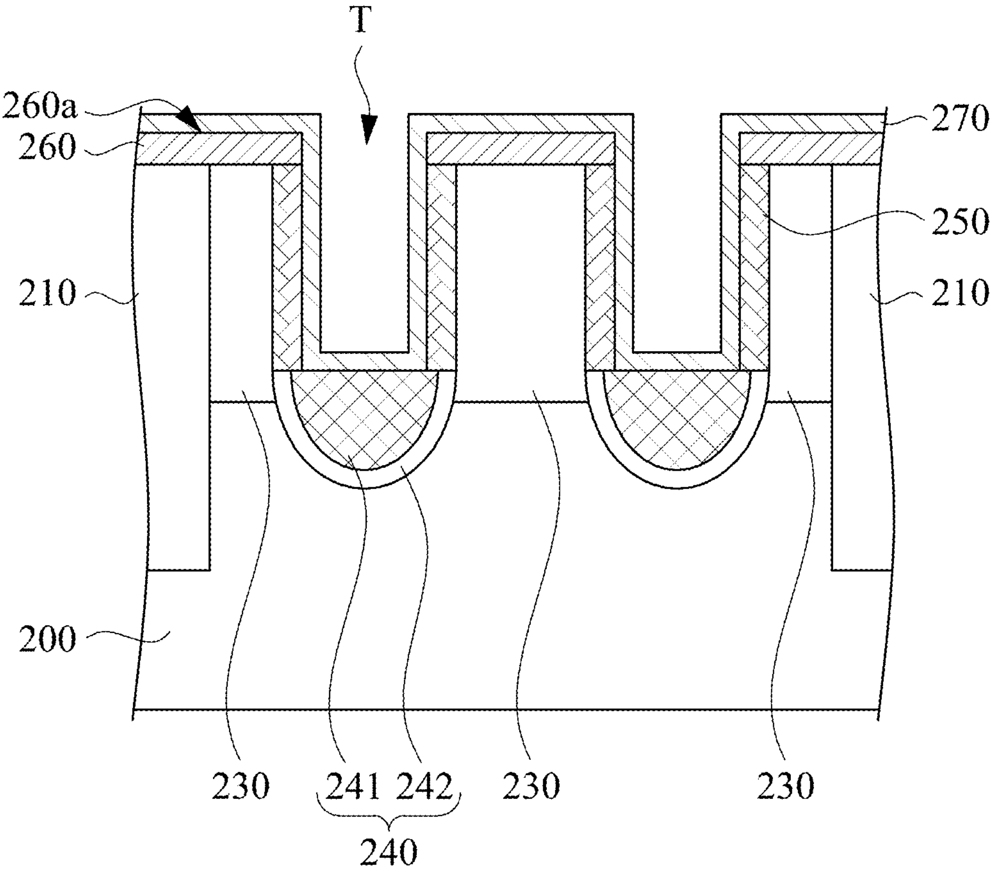

Reference is then made to FIG. 11. A first nitride spacer 270 is formed lining the trenches T. In some embodiments, the first nitride spacer 270 is formed lining a top surface 260*a* of the dielectric layer 260. In some embodiments, the first nitride spacer 270 and the dielectric layer 260 include the same material.

Figure 12:
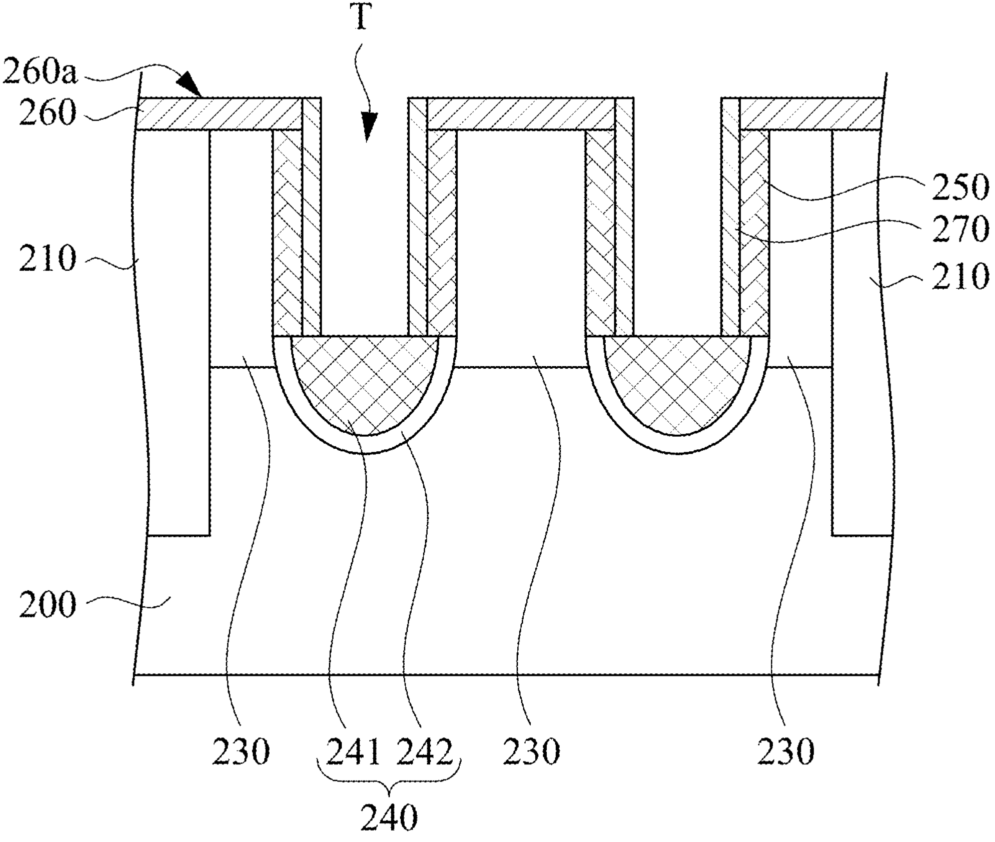

Reference is then made to FIG. 12. The first nitride spacer 270 is etched to expose the gate structures 240 (e.g., the gate electrodes 241). In some embodiments, the etching process is performed to remove horizontal portions of the first nitride spacer 270 such that the top surface 260*a* of the dielectric layer 260 is exposed.

Figure 13:
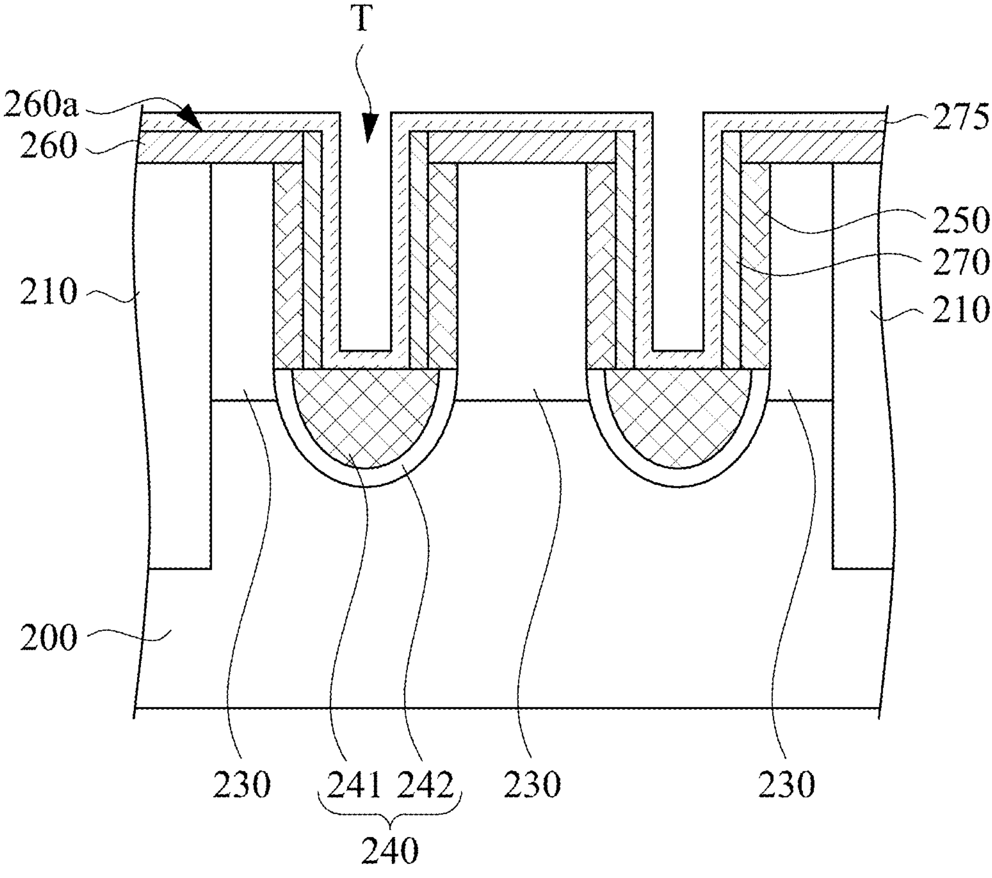

Reference is then made to FIG. 13. A second nitride spacer 275 is formed lining the dielectric layer 260, the remaining portions of the first nitride spacer 270 and the gate structures 240. Moreover, in some embodiments, the second nitride spacer 275 is formed covering and in contact with the top surface of the gate structures 240. In some embodiments, the second nitride spacer 275 includes a different material than the first nitride spacer 270. To be more specific, the first nitride spacer 270 is made of a dielectric material, while the second nitride spacer 275 is made of a conductive material. For example, the first nitride spacer 270 may be made of silicon nitride, and the second nitride spacer 275 may be made of titanium nitride.

It should be noted that during the formation of the second nitride spacer 275, the first nitride spacer 270 separates the second nitride spacer 275 from the second isolation structures 250.

Figure 14:
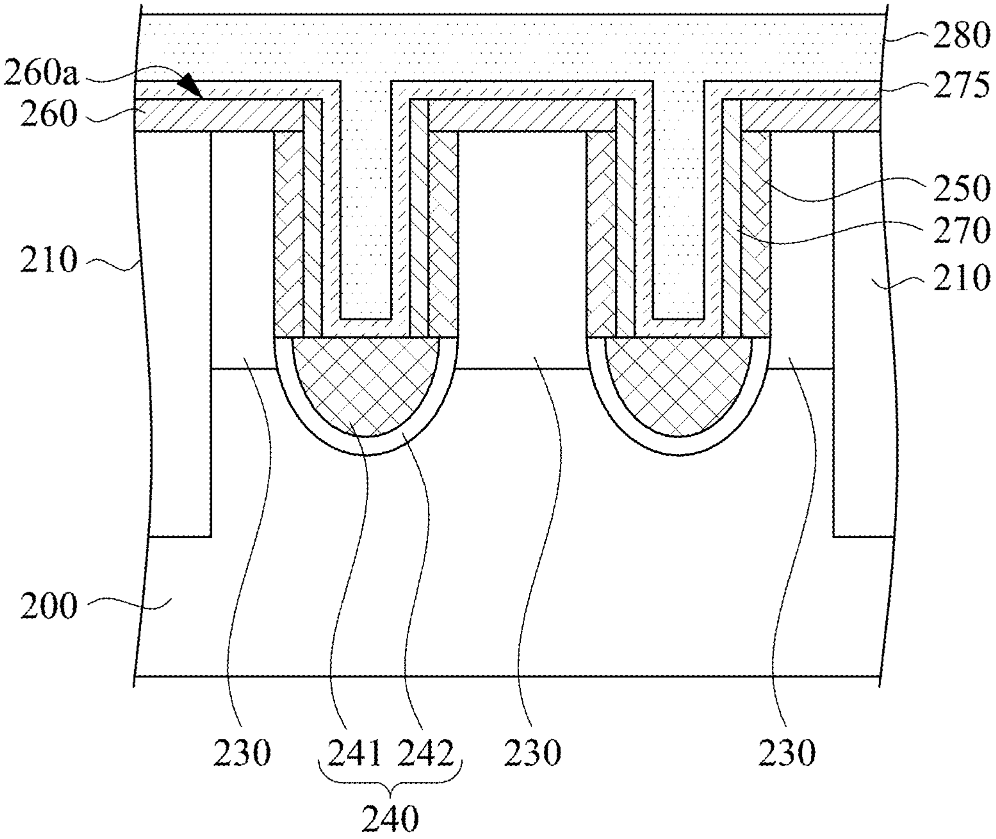

Reference is then made to FIG. 14. A metal layer 280 is formed overfilling the trenches T and over the gate structures 240. In some embodiments, the metal layer 280 is made of tungsten (W). As aforementioned, in embodiments where the metal layer 280 includes tungsten, the second nitride spacer 275 may be made of titanium nitride or the like to promote adhesion and the first nitride spacer 270 containing silicon nitride is deposited lining the trenches T to improve the surface coverage of the second nitride spacer 275. Similarly, the dielectric layer 260 may be made of silicon nitride as well to further improve the surface coverage of the second nitride spacer 275 over the dielectric layer 260.

Figure 15:
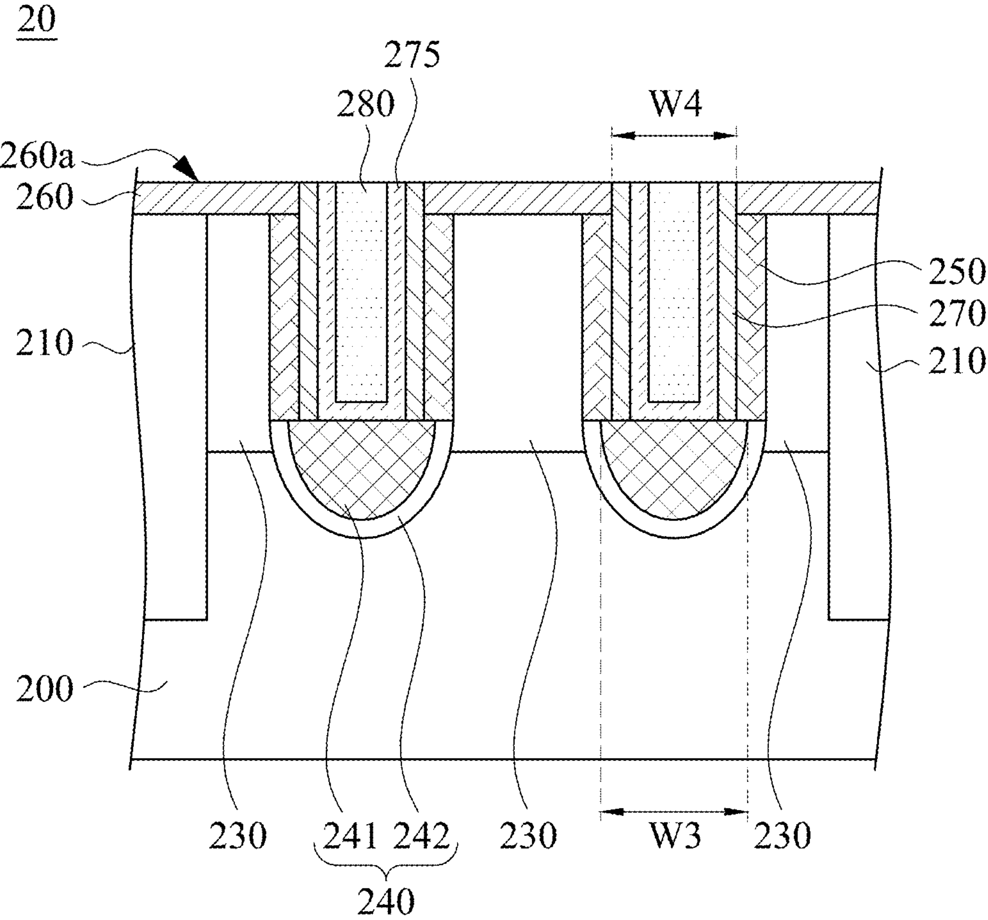

Reference is then made to FIG. 15. A planarization process is performed to the second nitride spacer 275 and the metal layer 280 until the dielectric layer 260 is exposed.

In the cross-sectional view of FIG. 15, the first nitride spacer 270 has a bar shape cross-section, and the second nitride spacer 275 has a U shape cross-section. In addition, the second nitride spacer 275 is spaced apart from the second isolation structures 250 through the first nitride spacer 270.

Furthermore, as shown in FIG. 15, the gate electrode 241 is in contact with both the first nitride spacer 270 and the second nitride spacer 275. To be more specific, a bottom end of the first nitride spacer 270 is coterminous with a bottom surface of the second nitride spacer 275.

A difference between the memory device 20 and the memory device 10 is that an outer sidewall of the first nitride spacer 270 is not coterminous with an edge of the gate electrode 241. To be more specific, the width W3 of the gate electrode 241 is greater than the width W4 of the first nitride spacer 270. In other words, an orthographic projection area of the gate electrode 241 projected on the substrate 200 is greater than an orthographic projection area of the first nitride spacer 270 projected on the substrate 200.

Reference is now made to FIG. 16 to FIG. 22. FIG. 16 to FIG. 22 are cross-sectional views of intermediate stages of a method of forming a memory device 30 according to some other embodiments of the present disclosure.

Figure 16:
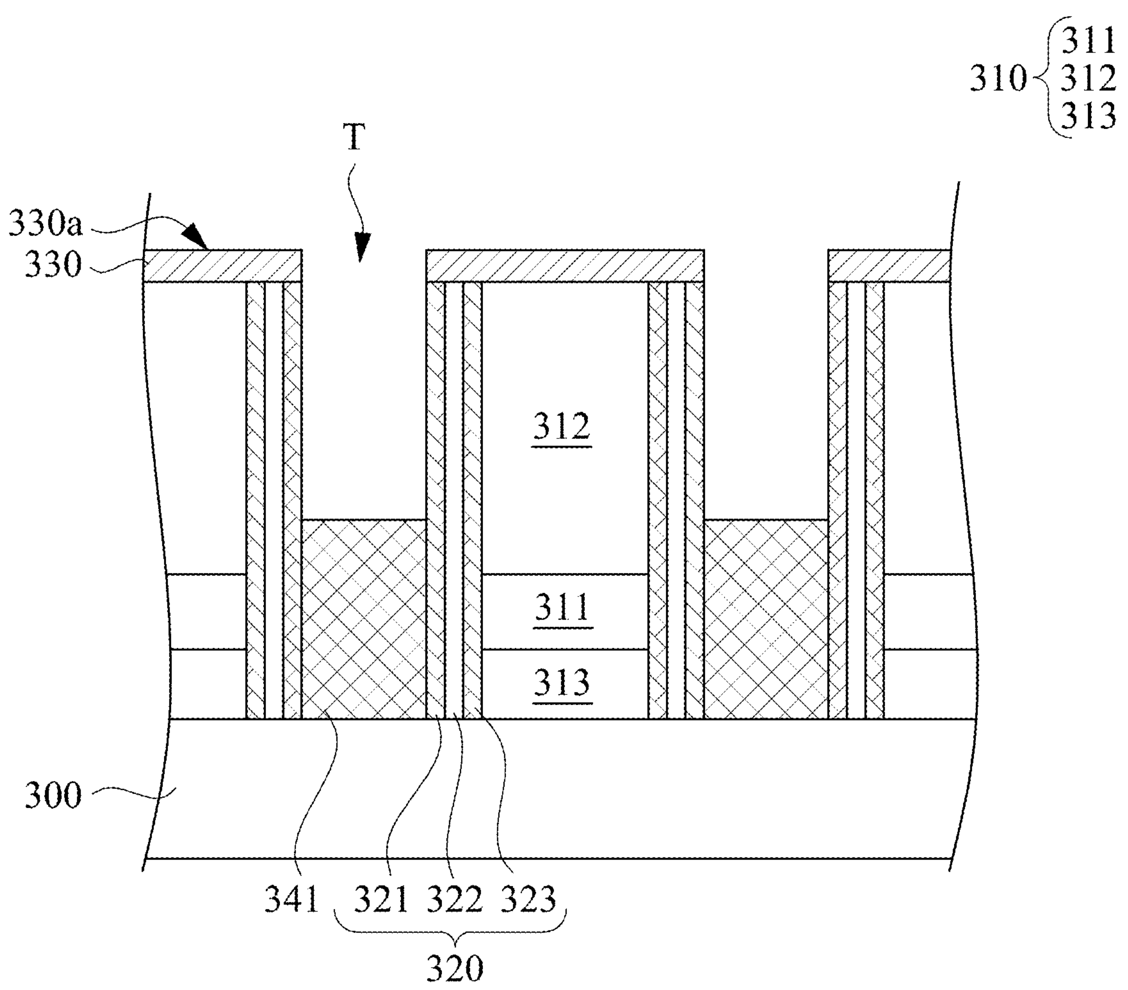
FIG. 16 to FIG. 22 are cross-sectional views of intermediate stages of a method of forming a memory device according to yet some other embodiments of the present disclosure.

Reference is first made to FIG. 16. Bit line structures 310 and spacer structures 320 are formed over a substrate 300. The spacer structures 320 are disposed along the respective bit line structures 310. In some embodiments, each of the bit line structures 310 includes a bit line 311, a cap layer 312, and a bit line contact 313. Each of the spacer structures 320 includes a spacer material 321, a spacer material 322, and a spacer material 323. In some embodiments, the spacer material 321 and the spacer material 323 are made of the same material, and the spacer material 322 is made of a different material than the spacer material 321 and the spacer material 323. For example, the spacer material 321 and the spacer material 323 may be made of silicon nitride, and the spacer material 322 may be made of silicon oxide. In addition, as shown in FIG. 16, a dielectric layer 330 is formed over the bit line structures 310 and the spacer structures 320.

As shown in FIG. 16, trenches T are formed through the dielectric layer 330 and along the spacer structures 320. Lower contact plugs 341 are formed in the respective trenches T. In some embodiments, the lower contact plugs 341 include poly-crystalline silicon (polysilicon).

Figure 17:
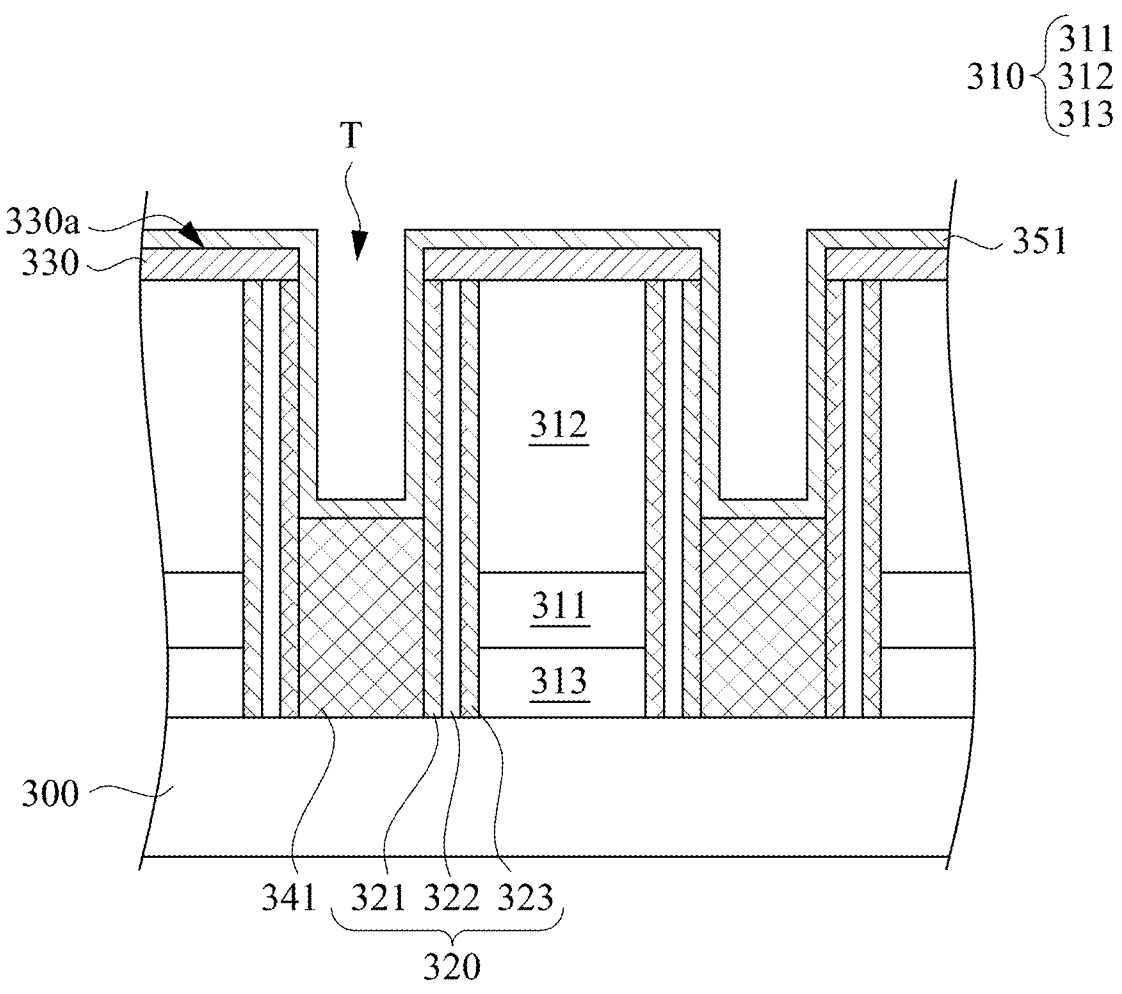

Reference is then made to FIG. 17. A first nitride spacer 351 is formed lining the trenches T. To be more specific, the first nitride spacer 351 is disposed lining the lower contact plugs 341 and a top surface 330*a* of the dielectric layer 330. In some embodiments, the first nitride spacer 351 and the dielectric layer 330 include the same material.

Figure 18:
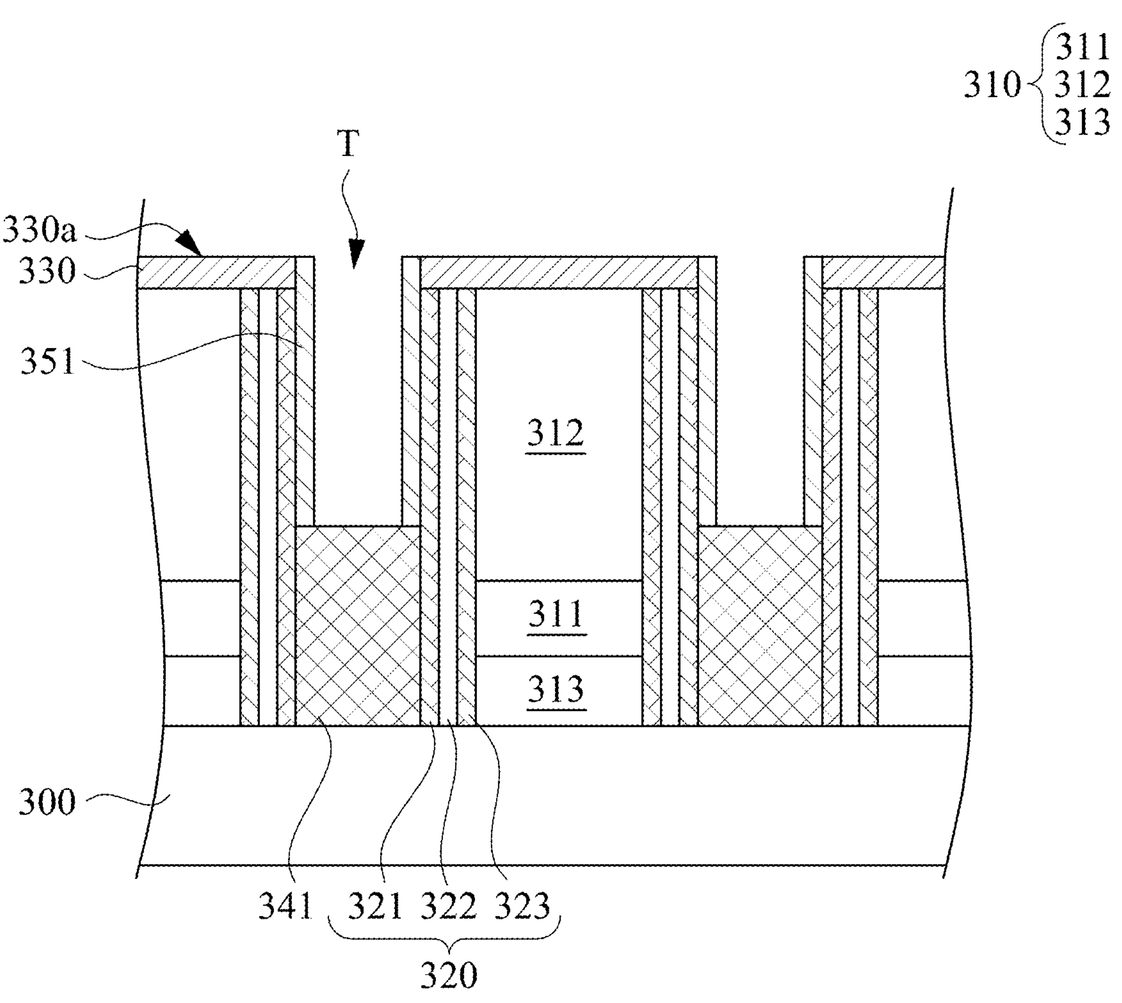

Reference is then made to FIG. 18. The first nitride spacer 351 is etched to expose the lower contact plugs 341. In some embodiments, the etching process is performed to remove portions of the first nitride spacer 351 such that the top surface 330*a* of the dielectric layer 330 is exposed.

Figure 19:
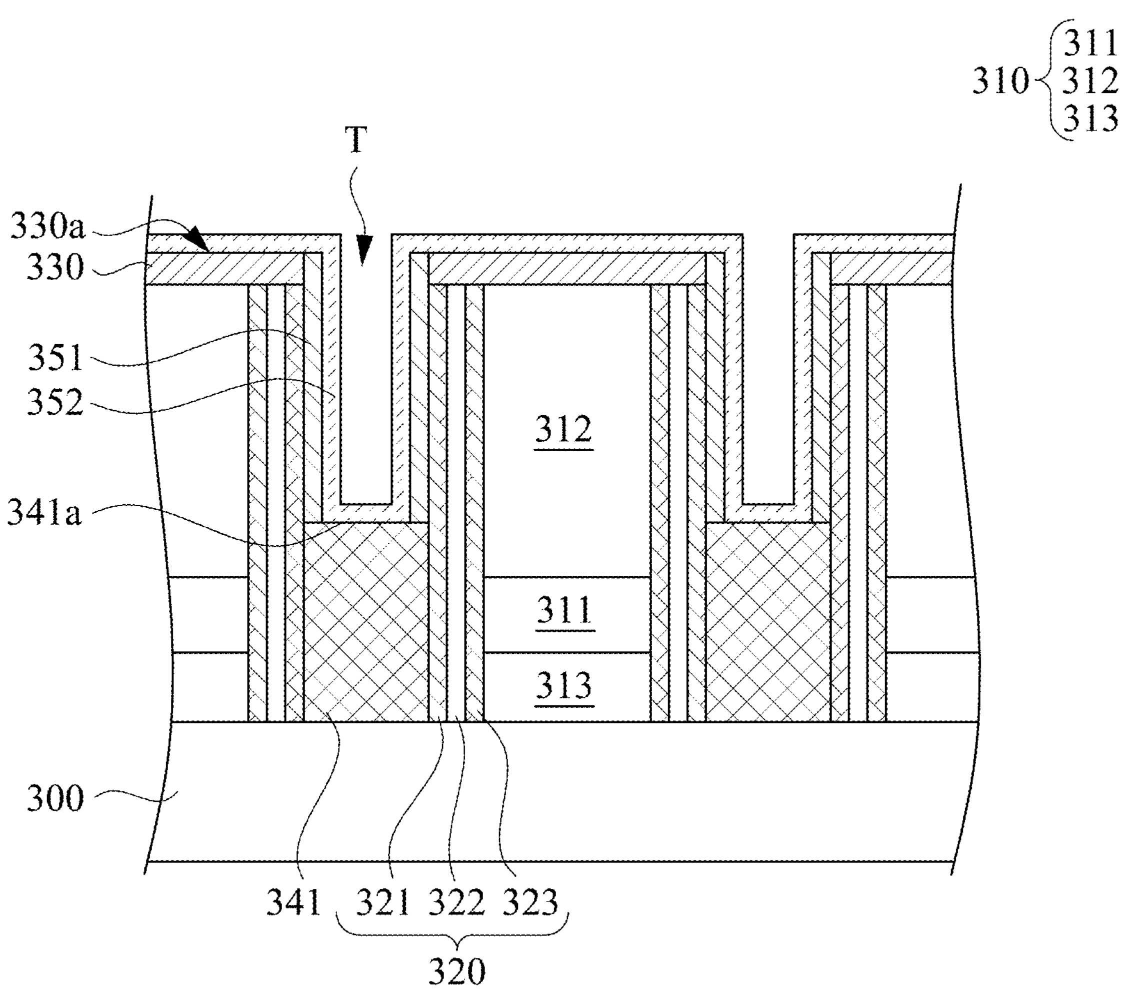

Reference is then made to FIG. 19. A second nitride spacer 352 is formed lining the dielectric layer 330, the first nitride spacer 351 and the lower contact plugs 341. In some embodiments, the second nitride spacer 352 is formed covering and in contact with the top surface 341*a* of the lower contact plugs 341.

In some embodiments, the second nitride spacer 352 includes a different material than the first nitride spacer 351. To be more specific, the first nitride spacer 351 is made of a dielectric material, while the second nitride spacer 352 is made of a conductive material. For example, the first nitride spacer 351 may be made of silicon nitride, and the second nitride spacer 352 may be made of titanium nitride.

It should be noted that during the formation of the second nitride spacer 352, the first nitride spacer 351 separates the second nitride spacer 352 from the spacer structures 320 and the bit line structures 310.

Figure 20:
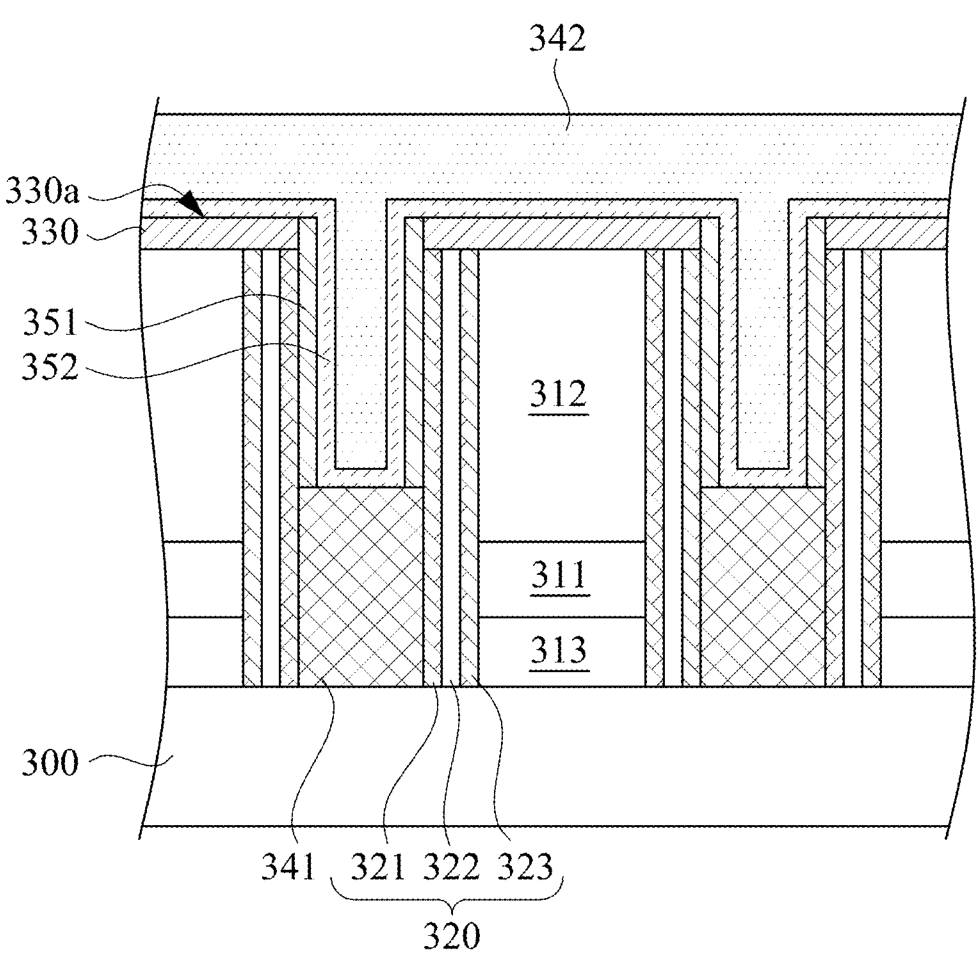

Reference is then made to FIG. 20. Upper contact plugs 342 are formed in the respective trenches T and over the respective lower contact plugs 341. In some embodiments, the upper contact plugs 342 are made of tungsten (W). As aforementioned, the second nitride spacer 352 may be made of titanium nitride or the like to promote adhesion and the first nitride spacer 351 that contains silicon nitride may be deposited lining the trenches T to improve the surface coverage of the second nitride spacer 352. Similarly, the dielectric layer 330 may be made of silicon nitride as well to further improve the surface coverage of the second nitride spacer 352 over the dielectric layer 330.

Figure 21:
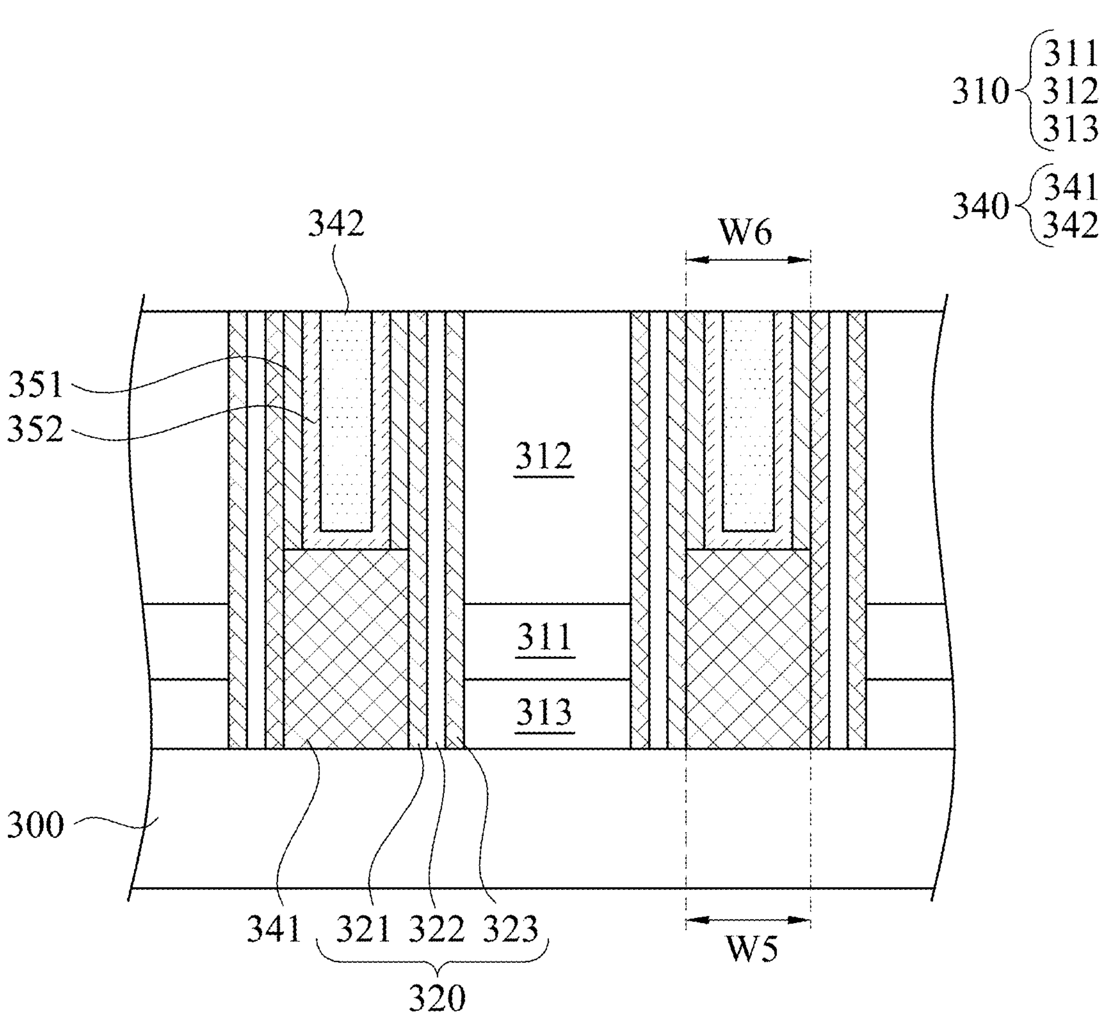

Reference is then made to FIG. 21. A planarization process is performed to the second nitride spacer 352 and the upper contact plugs 342 until the bit line structures 310 (e.g., the cap layers 312) are exposed. The lower contact plugs 341 and the upper contact plugs 342 are collectively referred to as capacitor contact structures 340.

Similar to the memory device 10, in the cross-sectional view of FIG. 21, the first nitride spacer 351 has a bar shape cross-section, and the second nitride spacer 352 has a U shape cross-section. In addition, the second nitride spacer 352 is spaced apart from the spacer structures 320 and the bit line structures 310 through the first nitride spacer 351.

Furthermore, since the lower contact plugs 341 and the first nitride spacer 351 are sequentially deposited in the trenches T, an outer sidewall of the first nitride spacer 351 is coterminous with an edge of the lower contact plugs 341. Moreover, the width W6 of the first nitride spacer 351 is substantially equal to the width W5 of the respective lower contact plugs 341. In other words, an orthographic projection area of the first nitride spacer 351 projected on the substrate 300 is overlapped with an orthographic projection area of the respective lower contact plugs 341 projected on the substrate 300.

In addition, as shown in FIG. 21, the lower contact plugs 341 are in contact with both the first nitride spacer 351 and the second nitride spacer 352. To be more specific, a bottom end of the first nitride spacer 351 is coterminous with a bottom surface of the second nitride spacer 352.

Figure 22:
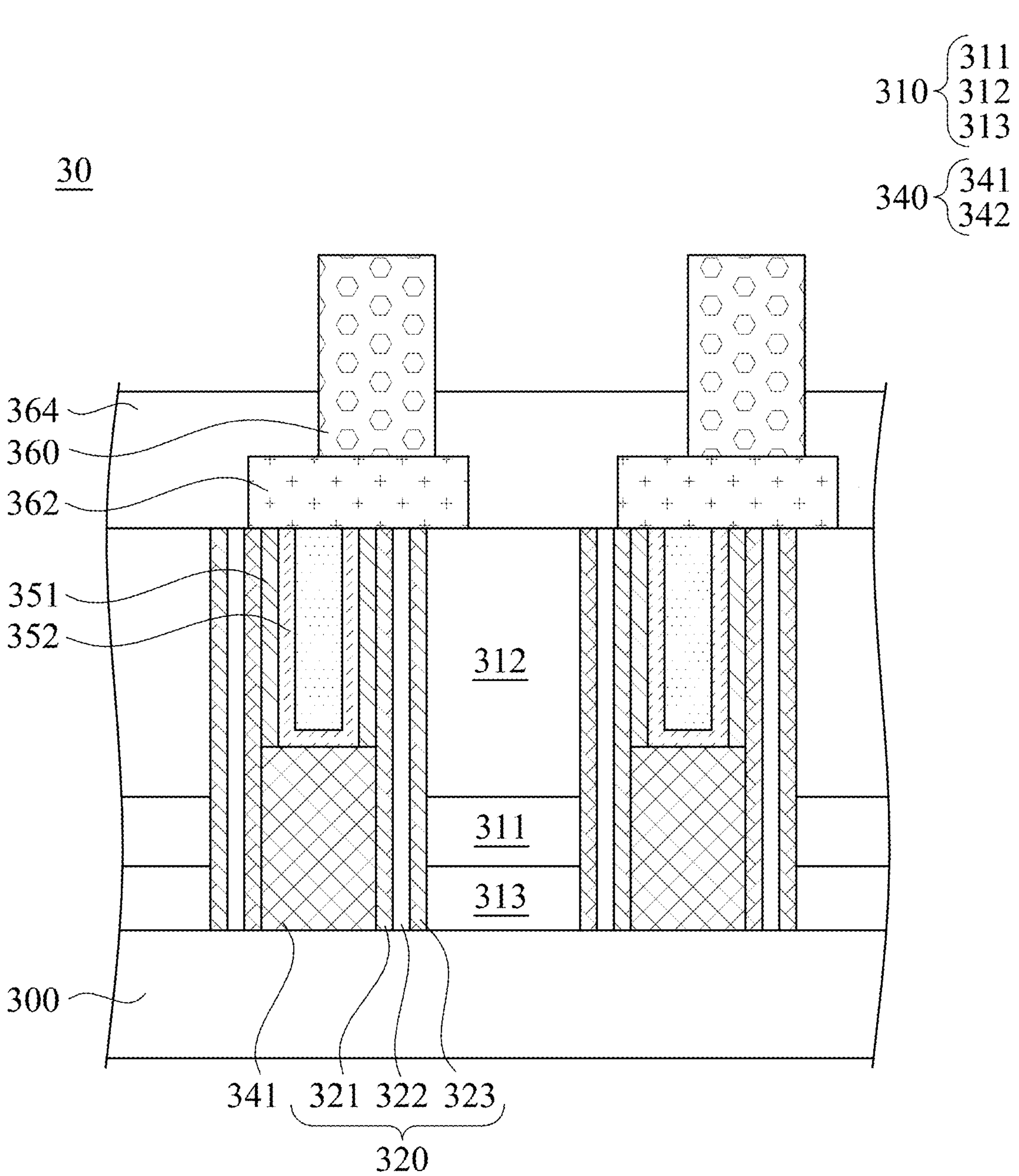

Reference is then made to FIG. 22. Capacitors 360 are formed electrically connected with the capacitor contact structures 340. In some embodiments, as shown in FIG. 22, the capacitors 360 extend through a dielectric layer 364 to landing pads 362 so that the capacitors 360 may be electrically connected with the capacitor contact structures 340.

Accordingly, in the memory device and the method of forming the memory device of some embodiments of the present disclosure, first nitride spacers made of silicon nitride are disposed lining deep trenches, and second nitride spacers made of titanium nitride are disposed over the first nitride spacers. This enhances the surface coverage of the second nitride spacers. Thereby, the tungsten-containing metal layer that is disposed on the second nitride spacers may have better adhesion, which leads to a memory device with reduced resistance and improved electrical contact.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure covers modifications and variations of this disclosure provided they fall within the scope of the following claims.

What is claimed is:

1. A method of forming a memory device, comprising:
- forming a trench in a dielectric structure;
- forming a conductive layer in the trench of the dielectric structure;
- forming a first nitride spacer lining the trench;
- etching the first nitride spacer to expose the conductive layer;
- forming a second nitride spacer lining the first nitride spacer and the conductive layer; and
- forming a metal layer in the trench and over the conductive layer.

2. The method of claim 1, further comprising performing a planarization process to the second nitride spacer and the metal layer until the dielectric structure is exposed.

3. The method of claim 2, wherein the planarization process is performed such that top surfaces of the dielectric structure, the first nitride spacer, the second nitride spacer, and the metal layer are substantially level with each other.

4. The method of claim 1, wherein the dielectric structure has an upper portion and a lower portion, and the upper portion comprises a same material as the first nitride spacer.

5. The method of claim 4, wherein the lower portion is made of oxide.

6. The method of claim 4, wherein the second nitride spacer is formed lining a top surface of the upper portion of the dielectric structure.

7. The method of claim 6, wherein the first nitride spacer separates the second nitride spacer from the lower portion of the dielectric structure during forming the second nitride spacer.

8. The method of claim 4, wherein the first nitride spacer is formed lining a top surface of the upper portion of the dielectric structure, and etching the first nitride spacer comprises removing a portion of the first nitride spacer, such that the top surface of the upper portion of the dielectric structure is exposed.

9. The method of claim 1, wherein the first nitride spacer and the second nitride spacer comprise different materials.

10. The method of claim 1, wherein the first nitride spacer is made of a dielectric material, and the second nitride spacer is made of a conductive material.

11. A memory device, comprising:

a dielectric structure;

a conductive layer in the dielectric structure;

a dielectric nitride layer lining a sidewall of the dielectric structure;

a conductive nitride layer extending from an inner sidewall of the dielectric nitride layer to a top surface of the conductive layer; and a metal layer over the conductive nitride layer.

12. The memory device of claim 11, wherein in a cross-sectional view, the dielectric nitride layer has a bar shape cross-section, the conductive nitride layer has a U shape cross-section.

13. The memory device of claim 11, wherein an outer sidewall of the dielectric nitride layer is coterminous with an edge of the conductive layer.

14. The memory device of claim 11, wherein the dielectric structure has an upper portion and a lower portion, and the upper portion comprises a same material as the dielectric nitride layer.

15. The memory device of claim 14, wherein the lower portion of the dielectric structure is made of a different material than the upper portion of the dielectric structure and the dielectric nitride layer.

16. The memory device of claim 14, wherein the conductive nitride layer is spaced apart from the lower portion of the dielectric structure through the dielectric nitride layer.

17. The memory device of claim 14, wherein the upper portion of the dielectric structure and the dielectric nitride layer are made of silicon nitride.

18. The memory device of claim 11, wherein the conductive layer is in contact with both the dielectric nitride layer and the conductive nitride layer.

19. The memory device of claim 11, wherein the conductive nitride layer is made of titanium nitride and the dielectric nitride layer is made of silicon nitride.

20. The memory device of claim 11, wherein a bottom end of the dielectric nitride layer is coterminous with a bottom surface of the conductive nitride layer.

* * * * *